United States Patent

Wilcox

[15] 3,644,749

[45] Feb. 22, 1972

[54] DIODE DELAY LINE

[72] Inventor: Milton E. Wilcox, Mesa, Ariz.

[73] Assignee: Motorola, Inc., Franklin Park, Ill.

[22] Filed: Aug. 5, 1970

[21] Appl. No.: 61,337

[52] U.S. Cl. ...........................307/208, 178/5.4 R, 307/293, 307/294, 307/318, 307/320, 333/29, 333/70

[51] Int. Cl. ........................................................H03k 17/28

[58] Field of Search .................178/5.4 R, DIG. 12; 307/208, 307/293, 294, 295, 318, 320; 328/56, 58, 165, 167; 333/29, 30, 31, 70

[56] References Cited

UNITED STATES PATENTS

| | | | |
|---|---|---|---|
| 3,195,077 | 7/1965 | Barditch et al. | 333/70 |
| 3,492,514 | 1/1970 | Korn | 307/320 |
| 3,022,472 | 2/1962 | Tanenbaum et al. | 307/320 X |
| 3,212,033 | 10/1965 | Husher et al. | 333/70 |
| 3,196,372 | 7/1965 | Lindeman et al. | 307/295 X |
| 3,309,610 | 3/1967 | Yamamoto | 307/318 X |
| 3,235,662 | 2/1966 | Bopp | 333/29 X |
| 3,529,179 | 9/1970 | Orrell, Jr. | 307/318 X |

*Primary Examiner*—Donald D. Forrer
*Assistant Examiner*—R. C. Woodbridge
*Attorney*—Mueller and Aichele

[57] ABSTRACT

A delay line adapted for fabrication in integrated circuit form and suitable for use in a television receiver or the like is in the form of an RC circuit in which the capacitors are zener diodes, slightly reverse-biased with respect to desired input signals applied to the delay line.

6 Claims, 3 Drawing Figures

INVENTOR.
MILTON E. WILCOX
BY Mueller & Aichele
ATTORNEYS.

DIODE DELAY LINE

BACKGROUND OF THE INVENTION

In the application of integrated circuit techniques to existing electronic circuits, it is desirable to obtain the functions of conventional circuits formed of discrete components with circuits which can be placed on an integrated circuit chip requiring a minimum number of connections to components located outside the integrated circuit chip. In the reduction of various circuits of color television receivers to integrated circuit form, the signal delay lines or circuits utilized in such receivers to delay the video signals have created a particular problem since the delay lines require capacitive components which must be mounted outside the integrated circuit chip. It then is necessary to provide bonding pads for the external components needed for the delay lines, thereby imposing limitations on the design of circuits which must necessarily include delay lines.

SUMMARY OF THE INVENTION

It is an object of this invention to provide an improved delay line.

It is an additional object of this invention to provide an improved delay line capable of fabrication as part of an integrated circuit.

It is a further object of this invention to form a nonlinear delay line utilizing Zener diodes as capacitances.

It is still another object of this invention to form a delay line also operative to clip or clamp signals in excess of a predetermined amount.

In accordance with a preferred embodiment of this invention, a delay line is formed of a plurality of resistances coupled between a signal input terminal and a signal output terminal, with the resistances being coupled together at a plurality of junctions. Reverse-biased Zener diodes are coupled to each of the junctions of the resistances, with a DC bias potential being supplied to the Zener diodes causing them to operate as capacitance means, the value of the capacitance being dependent upon the relative potentials of the bias potential and the signal applied to the input terminal.

In a more specific form, the delay line is a monolithic integrated circuit, with the Zener diode being in the form of emitter-base junctions operated in the reverse-biased mode.

DETAILED DESCRIPTION

Figures 1, 2, 3:
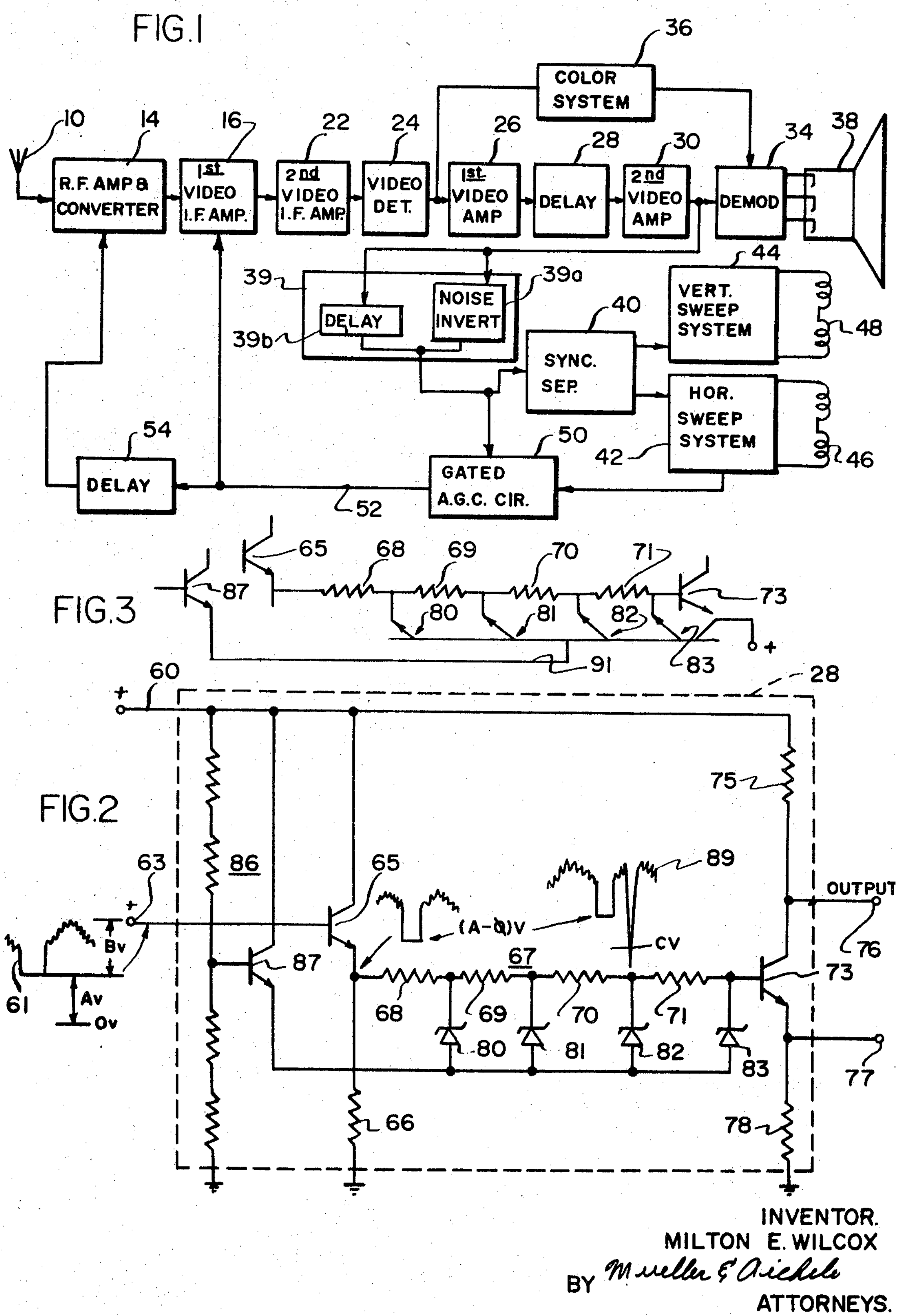
FIG. 1 is a block diagram of a television receiver in which delay circuits may be employed.
FIGS. 2 and 3 are detailed circuit diagrams of delay circuits in accordance with preferred embodiments of this invention.

Referring now to the drawings, there is shown in FIG. 1 a typical color television receiver in which an incoming signal is received by an antenna 10 and is applied to a radiofrequency amplifier and converter stage 14, which amplifies and reduces the frequency of the received signals to provide intermediate frequency (IF) signals. These IF signals then are amplified in a series of video IF amplifiers, indicated in the drawing as first and second IF amplifiers 16 and 22. The output of the second IF amplifier is detected in a video detector stage 24 to provide a composite video signal, with the brightness components and synchronizing components in the video signal being amplified in a first video amplifier circuit 26 and also being applied to the input of a color processing system 36, responsive to the color signal components of the detected video signal.

The amplified brightness and synchronizing signal components from the output of the first video amplifier stage 26 are delayed in a delay circuit 28, for purposes well known to those skilled in the art, are amplified in a second video amplifier stage 30, and are applied to one input of a direct demodulator circuit 34. The composite chroma signal components, after being processed in the color system 36, are applied to another input of the demodulator 34, which produces the red, blue and green video voltages directly on three outputs coupled with the three different cathodes of a color cathode ray tube 38.

In addition to providing the brightness signal components to one of the inputs of the demodulator circuit 34, the second video amplifier stage 30 supplies the composite video signal to a noise gate 39 including a noise inverter 39*a* and a delay circuit 39*b*, with noise components in excess of the signal synchronizing components from the composite signal being removed at the output of the delay circuit 39*b* in the noise gate 39 to provide noise free video signals to a synchronizing signal separator circuit 40, which supplies the horizontal and vertical synchronizing signal components to the horizontal and vertical sweep systems 42 and 44, respectively. The sweep systems 42 and 44 develop the horizontal and vertical sweep signals in a horizontal deflection winding 46 and a vertical deflection winding 48, each of which is disposed on the neck of the cathode ray tube 38.

The noise-free video signal also is applied to a gated automatic gain control (AGC) circuit 50 which is gated by the horizontal retrace pulse to develop a gain control signal during the gated intervals. The gain control signal appears on a conductor 52 and changes in amplitude according to the peak amplitude of the synchronizing pulse components present during the gating interval. The strength or magnitude of the synchronizing pulse components is, in turn, dependent upon the strength of the incoming signals appearing at the antenna 10; so that the voltage appearing on the lead 52 is representative of the input signal strength. Depending on the nature of the circuit with which the gain control circuit 50 is used, the gain control voltage on the lead 52 may be either a forward or reverse gain control voltage and is applied to a first video IF stage 16 and is delayed by a suitable delay circuit 54 and applied to the RF and converter stage 14. Thus, the gain control voltage operates initially to control the gain of the video IF stage 16 and for increasing signal levels operates to control the gain of the RF and converter stage 14, in a manner which is well known.

In order to implement the various circuits illustrated in FIG. 1 as integrated circuits for a television receiver, it is desirable to cause the delay device 28 and the delay circuit 39*b* used in the noise gate 39, or any other portions of the receiver requiring a delay circuit, to be capable of formation as part of an integrated circuit either as an independent component or as part of a larger signal processing circuit.

Referring now to FIG. 2, there is shown in detail a delay circuit which may be utilized for the delay 28 or 39*b* illustrated in block form of FIG. 1. The circuit shown in FIG. 2 may be fabricated as a separate integrated circuit or as part of a larger integrated circuit, with all of the components enclosed within the dotted line being formed on the integrated circuit chip. A positive operating potential is applied to an input terminal or bonding pad 60 and may be derived from any suitable source within the television receiver or any other circuit utilizing the delay circuit shown in FIG. 2. The input signals, such as the composite, amplified, detected video signals (shown by waveform 61) obtained from the output of the second video amplifier 30 are applied to the input terminal 63 of the delay circuit. These signals have as the most negative-going portion thereof the synchronizing signal portions, which are at some voltage Av above ground, with the remainder of the video information signal (including these synchronizing signal portions) extending above the most negative tips of the synchronizing signal portions in a second voltage range Bv.

Input signals applied to the input terminal 63 are supplied to the base of an NPN emitter-follower transistor 65, the emitter of which is coupled through a suitable resistor 66 to ground and the collector of which is connected to the B+ terminal 60. As a consequence, the signals appearing on the emitter of the transistor 65 are of the same configuration as the signals 61, but are translated downwardly by the amount of the base-emitter drop (one 0) of the emitter-follower transistor 65. In a typical transistor, this causes the most negative-going portion of the synchronizing signal portion of the composite signal to be 0.6 or 0.7 volts lower than the corresponding portion of the signal applied to the input terminal 63.

The output signals appearing on the emitter of the transistor 65 then are applied to a multisection delay line 67, which is illustrated as including four resistors 68, 69, 70 and 71 connected in series between the emitter of the transistor 65 and the base of an output amplifier NPN-transistor 73. Output signals which are inverted with respect to the input signals applied to the base of the transistor 73, are obtained from an output terminal 76 connected to the junction of the collector of the transistor 73 with a load resistor 75. Similarly, the emitter of the transistor 73 is connected through an emitter resistor 78 to ground, so that normal or noninverted output signals may be obtained on an output terminal 77 connected to the emitter. The choice of which of the two output terminals is used in any particular application depends on the requirements of the circuit components following the delay line circuit 28 illustrated in FIG. 2.

The portion of the circuit described thus far, of course, will not delay any signals applied to it; and in order to complete the delay line, a plurality of Zener diodes 80 to 83 are provided. The cathodes of the diodes 80 to 83 are connected to each of the junctions between successive ones of the resistors 60 to 71, with the cathode of the final diode 83 being connected to the junction of the resistor 71 with the base of the output transistor 73.

Since the diodes 80 to 83 are formed of semiconductor junctions of N and P material as part of the integrated circuit, these diodes exhibit the characteristic of all semiconductor diodes of having a capacitance which may be expressed as $C=\epsilon A/d$, where $\epsilon$ is a property of the material forming the diode, $A$ is the area of the junction between the N and P regions of the diode, and $d$ is the width of the depletion region. The diodes 80 to 83 exhibit the characteristic that as the reverse-bias voltage across the diode junction is increased, the width of the depletion region $d$ increases, thereby reducing the capacitance of the diode until the conduction point of the diode is reached. Thus, the highest capacitance exhibited by the diode occurs when the voltage across the junction is at or near 0 volts for a very slight reverse bias.

Since the most negative-going portion or voltage of the desired signal components present on the emitter of the emitter-follower transistor 65 is known, a biasing potential can be applied to the anodes of the diodes 80 to 83 to cause the reverse-bias voltage across the diode junction to be as near zero as possible without clipping the desired signal components. This is accomplished by obtaining a biasing potential from a resistive voltage divider 86 connected between the positive input terminal and ground. This biasing potential is applied to the base of an NPN-transistor 87, the emitter of which is connected to the anodes of all of the Zener diodes 80 to 83, and the collector of which is connected to the source of positive potential. The biasing potential thus applied to the anodes of the diodes 80 to 83 is selected to bias the anodes of these diodes to a point which is a predetermined amount lower or closer to ground than the most negative-going desired portion of the input signal present on the emitter of the transistor 65.

The particular bias which is applied to the Zener diodes 80 t0 83 from the transistor 87 is a compromise provided to give sufficient tolerances to prevent clamping or clipping of the synchronizing components in the desired signal, while obtaining the maximum possible capacitance from the Zener diodes 80 to 83. With the circuit biased in this manner, the delay line 67 operates in the same manner as an RC coupled delay line for signals of a given magnitude.

It should be noted, however, that noise signal components frequently occur in a composite television signal, with the noise signal components frequently extending to a point considerably more negative than the desired synchronizing signal components. By properly adjusting the bias provided to the anodes of the Zener diodes 80 to 83 with respect to the tips of the synchronizing signal components in the composite signal, the noise signal components often extend sufficiently below the synchronizing signal tips so as to forward bias the Zener diodes 80 to 83. When this occurs, the Zener diode to which such a signal is applied becomes forward conductive and clamps the noise signal component at a point which is equal to the bias voltage applied to the anodes of the Zener diodes less the voltage drop in the forward direction across the diode. Thus, the undesired noise components are limited to a predetermined value; so that if the outputs of the output transistor 73 are applied to a gated AGC circuit or to the picture tube of a television receiver, the effect of such noise components on the performance of these portions of the receiver is minimized.

It further should be noted that as the signal components of the composite signal which are applied from the emitter of the transistor 65 to the delay line 67 more closely approach the point at which the Zener diodes have a zero bias voltage thereacross, a maximum capacitance for these signals is exhibited by the diodes. Thus, the most negative-going signal components undergo a greater delay than the more positive signal components. For a short delay line, with the signal components in a relatively narrow range of voltages, this phenomenon is insignificant. If, however, it is desired to take advantage of this nonlinear characteristic in order to provide phase modulation of signals in proportion to a signal applied to the junction of the voltage divider 86 and the base of transistor 87, or in proportion to the DC or average voltage level of the signal 61, a delay line with more sections could be utilized with a wider swing or range of potentials applied to the delay line; so that the effect of this nonlinear delay would be more noticable. Thus, the signal components or biasing potentials which cause the bias across the Zener diodes to approach the zero voltage level would cause a greater delay than the signal components or biasing potentials which cause the bias voltage across the Zener diode junctions to be substantially greater, with a corresponding reduction in the capacitance of the Zener diodes 80 to 83.

As shown in FIG. 3, when the Zener diodes 80 to 83 are fabricated as part of an integrated circuit, the diode junctions 80 to 83 may be formed from a number of emitter-base junctions of a multiple emitter, single base NPN transistor, the collector 90 of which is connected to a source of positive potential and the base 91 of which is connected to the emitter of the transistor 87. Since the entire delay line can be formed on the same integrated circuit as the remainder of the components, it is not necessary to provide extra bonding pads or external connections for discrete capacitors, as is the case with conventional RC delay lines. It should be noted, however, that the number of sections of the delay line (and thus the number of diodes) may be less than or greater than the number shown in the drawing.

The use of zener diodes as the capacitance elements also serves to establish an upper limit to the signal band passed by the delay line, with the upper limit being determined by the reverse or Zener breakdown voltage of the diodes. For systems not requiring such an upper limit, diodes having a high peak inverse voltage rating could be used in place of the Zener diodes.

I claim:

1. A monolithic integrated circuit delay line including in combination:

a signal input terminal and a signal output terminal;

at least first and second resistance means coupled together at a junction in series between said signal input terminal and said signal output terminal;

means for applying input signals to said signal input terminal, the magnitude of the applied signals being within a predetermined range of potentials;

at least first and second zener diode means, each having first and second terminals, the first terminal of said first zener diode means being coupled with said signal output terminal and the first terminal of said second zener diode means being coupled with said junction of said first and second resistance means;

means for applying a bias potential to the second terminals of said first and second zener diode means to cause said first and second zener diode means to operate as capacitance means, the value of the capacitances thereof being dependent on the relative values of the bias potential and said applied signal potential, the value of said bias potential further being insufficient to forward bias said first and second zener diode means for input signals lying within said predetermined range of potentials, said first and second zener diode means becoming forward biased to clamp input signals outside said predetermined range by a predetermined amount to the value of said bias potential.

2. The combination according to claim 1 further including first transistor amplifier means coupled with the signal input terminal for supplying input signals thereto and a second transistor amplifier means coupled with the signal output terminal for receiving signals therefrom, the first and second transistor amplifier means, being formed as a part of said integrated circuit.

3. A nonlinear delay line including in combination:

at least first and second resistance means coupled together at a junction in series between a signal input terminal and a signal output terminal;

means for applying input signals to the input signal terminal with the input signals falling within a predetermined range of potentials and subject to noise signal portions extending beyond said predetermined range in a predetermined direction;

first zener diode means having an anode and a cathode with the cathode thereof coupled to the signal output terminal;

second zener diode means having an anode and a cathode and having the cathode thereof coupled to the junction between the first and second resistance means;

means coupled with the anodes of the first and second zener diode means for applying a predetermined bias potential thereto, the bias potential being beyond said predetermined range in the direction to which the noise signal portions of the input signal extend, the first and second zener diode means exhibiting a capacitance which is dependent upon the relative potential thereacross in accordance with the instantaneous value of the input signal, so that the delay imposed by said delay line is proportional to the magnitude of the input signal relative to the magnitude of the bias potential.

4. The combination according to claim 3 wherein the predetermined range of potentials constituting the range of input signals extends from a first potential to a second potential, with the first potential being more positive than the second potential, and wherein the bias potential applied to the anodes of the zener diodes is a third potential which is less positive than the second potential, so that the greatest amount of delay provided by the delay line occurs for input signals at or near the second potential since the potential difference across the zener diode means is the least for such signals so long as the zener diode means are not biased into the forward conducting region thereof, input signals having a potential sufficient to cause the zener diode means to become forward biased being clamped to the third potential applied to the anodes of the zener diode means.

5. The combination according to claim 4 further including an input transistor having collector, base and emitter electrodes, the emitter electrode thereof being coupled with the signal input terminal, with said input signals being applied to the base of the input transistor, and a second transistor having collector, base and emitter electrodes, the base electrode of the second transistor being coupled to the output terminal with the emitter and collector electrodes of the second transistor being adapted to provide output signals therefrom, the input and second transistors, the first and second resistance means, and the first and second zener diode means all being part of a single integrated circuit.

6. The combination according to claim 3 wherein said nonlinear delay line is formed as a monolithic integrated circuit and said first and second zener diode means are fabricated as a multiple-emitter, single-base transistor, having at least first and second emitters, the base of which comprises a common anode for said first and second zener diode means, and the first and second emitters of which comprise the cathodes of said first and second zener diode means, respectively.

* * * * *